(12) United States Patent
Barash

(10) Patent No.: US 7,353,448 B1
(45) Date of Patent: Apr. 1, 2008

(54) METHODS, ARCHITECTURES, CIRCUITS AND SYSTEMS FOR TRANSMISSION ERROR DETERMINATION

(75) Inventor: Dror Barash, Rannana (IL)

(73) Assignee: Marvell Semiconductor Israel Ltd., Misgav (IL)

( * ) Notice: Subject to any disclaimer, the term of this patent is extended or adjusted under 35 U.S.C. 154(b) by 504 days.

(21) Appl. No.: 10/690,780

(22) Filed: Oct. 21, 2003

(51) Int. Cl.
*H03M 13/00* (2006.01)
*G01R 31/28* (2006.01)

(52) U.S. Cl. ............ 714/781; 714/758; 714/776; 714/712

(58) Field of Classification Search .............. None
See application file for complete search history.

(56) References Cited

U.S. PATENT DOCUMENTS

| | | | |
|---|---|---|---|
| 5,410,546 A | | 4/1995 | Boyer et al. |
| 5,724,368 A | | 3/1998 | Zook |
| 5,951,707 A | | 9/1999 | Christensen et al. |
| 6,029,186 A | | 2/2000 | DesJardins et al. |
| 6,061,820 A | * | 5/2000 | Nakakita et al. ............ 714/751 |
| 6,223,320 B1 | | 4/2001 | Dubey et al. |
| 6,233,251 B1 | * | 5/2001 | Kurobe et al. ............. 370/471 |
| 6,324,669 B1 | * | 11/2001 | Westby .................. 714/805 |
| 6,370,667 B1 | | 4/2002 | Maki |
| 6,598,200 B1 | * | 7/2003 | Greenwood et al. ........ 714/774 |
| 2001/0037481 A1 | | 11/2001 | Suzui et al. |

FOREIGN PATENT DOCUMENTS

WO   WO 02/093753 A1   11/2002

OTHER PUBLICATIONS

Chris Borrelli; IEEE 802.3 Cyclic Redundancy Check; Mar. 23, 2001; 8 Pages; XAPP209 (v1.0); XILINX.
Prestera-FX930 data sheet, from www.marvell.com; Marvell International, Sunnyvale, CA.
Prestera-FX9110/FX9210 data sheet, from www.marvell.com; Marvell International, Sunnyvale, CA.
Prestera-FX9130 data sheet, from www.marvell.com; Marvell International, Sunnyvale, CA.
Prestera-FX902 data sheet, from www.marvell.com; Marvell International, Sunnyvale, CA.
Prestera-FX900 data sheet, from www.marvell.com; Marvell International, Sunnyvale, CA.
Marvell press release, Jun. 23, 2003; www.marvell.com/press/pressNewsDisplay.do?releaseID=362.

(Continued)

*Primary Examiner*—Phung My Chung

(57) ABSTRACT

Methods, circuits, architectures, software and systems for error detection in transmitted data. The method generally includes receiving data and non-data, the data including fixed length data portions, removing non-data; and if the data includes a remainder, adding a zero-pad vector to generate a zero-padded data portion, then checking the data and zero-padded data portions for a transmission error. The circuit generally includes a circuit to detect non-data; a circuit configured to replace non-data with a zero-pad vector; and a circuit to detect a transmission error in data and zero-padded data portions of information, and combine the zero-pad vector with a remaining data portion to form the zero-padded data portion. The present invention enables a single error detection circuit to detect errors, thereby reducing chip area, increasing efficiency, and reducing power consumption.

63 Claims, 6 Drawing Sheets

OTHER PUBLICATIONS

Marvell press release, Apr. 29, 2002; www.marvell.com/press/pressNewsDisplay.do?releaseID=46.

Dror Barash; "Methods, Architectures, Circuits, Software and Systems for CRC Determination"; U.S. Appl. No. 10/794,496, filed Mar. 3, 2004.

Dror Barash; "Methods, Circuits, Architectures, Software and Systems for Determining a Data Transmission Error and/or Checking or Confirming Such Error Determinations"; U.S. Appl. No. 10/795,003, filed Mar. 3, 2004.

* cited by examiner (PRIOR ART)

METHODS, ARCHITECTURES, CIRCUITS AND SYSTEMS FOR TRANSMISSION ERROR DETERMINATION

FIELD OF THE INVENTION

The present invention generally relates to the field of data transmission error determinations. More specifically, embodiments of the present invention pertain to methods, architectures, circuits, software and systems for cyclic redundancy checking ("CRC") in a data storage or communications network.

DISCUSSION OF THE BACKGROUND

CRC is a well-known, conventional technique for finding data transmission errors. Typically, CRC is performed "on-the-fly" by hardware or logic circuitry, usually on serial data received in a device or system. Cyclic redundancy code (a result of a CRC determination) is typically generated at the data source, and is typically included in the header of a data packet or frame.

As shown in FIG. 1, a typical network data packet 10 comprises a plurality of words 12$a$-12$n$. The first word 12$a$ generally includes header 14 and data 16. Words 12$a$-12$n$ generally have a fixed length (e.g., $2^n$ bits, where $4 \leq n \leq 7$; typically, n=5). Header 14, on the other hand, may have a fixed length or a variable length, depending on the network and/or system. The header is not data, and for this and other reasons, it is not included in a CRC determination. Where header 14 has a length greater than the fixed length of words 12$a$-12$n$, the CRC is not calculated on words that contain only header information. Rather, the CRC calculation starts from the first word that contains some data.

Conventionally, the need to exclude header 14 from a CRC determination resulted in at least two sets of CRC hardware in a device or system configured to perform CRC determinations on incoming data. One set of CRC hardware operated on fixed length data words, and another set of CRC hardware operated on data words having a length less than the fixed length. In systems where the header may have a variable length, there are often a number of additional sets of CRC determining hardware equal to the number of possible lengths of the header.

An example of a simple version 100 of such a CRC architecture is shown in FIG. 2. Serial data is received by receiver 110 and is transferred to a logic/processing block 120 that detects the header 14 and removes it from the data stream. (Other functional circuit blocks of architecture 100 are not shown for purposes of clarity in explaining the background.) The output of block 120 is input into a 1:2 demultiplexer (or switch) 125, which selects an output 135 or 145 depending on the state of control signal CONTROL. The state of control signal CONTROL is determined by the presence or absence of the header 14 in words 12$a$-12$n$. When block 120 detects header 14 in word 12$a$, the serial data is output on bus 135 to CRC block 130, which (at best) is configured to process a fixed-length, $2^n$-$2^m$ bit quantity of data, and which may be configured as a plurality of CRC blocks, successively configured to process fixed-length, $2^{n-1}$, $2^{n-2}$ and so on down to $2^0$ bit quantities of data. Otherwise, the serial data is output on bus 145 to CRC block 140, which is configured to process a fixed-length, $2^n$ bit quantity of data.

This approach is highly inefficient in terms of chip area. A significant amount of chip real estate is dedicated to circuitry that is used infrequently or, in some variable-length header cases, not at all. Such architectures also unnecessarily consume power to keep all of the CRC circuitry active, even when it is not in use. In many cases, some bus lengths to and from second, third and/or further CRC blocks are relatively long, and thus consume incrementally greater power when transmitting data, in comparison with the main (e.g., $2^n$ bit) CRC block. In some implementations, valuable processing cycles are used to determine the header length prior to CRC determination, thus rendering such approaches inefficient in terms of operational processing speed as well.

Furthermore, CRC block 130 also receives and processes a "First Vector" having a predetermined value. Typically, the "First Vector" has a bit length equal to the width of the CRC processing block 130 (in the case of FIG. 2, $2^n$-$2^m$ bits) and is a series of all "ones" in digital or binary logic (e.g., 1111 . . . 1). The "First Vector" is typically used to begin a CRC calculation, as it has a known effect on the calculation (e.g., it gives a known result) and is typically a disallowed data pattern. Of course, the same "First Vector" is also used to begin calculation of the CRC transmitted with the data packet.

A need therefore exists to maximize the operational efficiency and the functional circuit area efficiency of CRC circuitry to keep up with ever-increasing demands for increased network speeds, smaller chip and board sizes and reduced power consumption.

SUMMARY OF THE INVENTION

Embodiments of the present invention relate to circuitry, architectures, systems and methods for checking data for transmission errors or determining if an information transmission error has occurred. The method generally comprises the steps of (1) receiving the digital information comprising data and at least one non-data portion, the data comprising a plurality of data portions having a fixed length; (2) removing the at least one non-data portion; and (3) if the data does not include a remainder having a length less than the fixed length, then checking the plurality of data portions for a transmission error; but if the data includes the remainder, then adding a zero-pad vector to the remainder to generate a zero-padded data portion having the fixed length, and checking the plurality of data portions and the zero-padded data portion for a transmission error. The software generally includes a set of instructions configured to implement or carry out the present method. The circuitry generally comprises (a) a first logic circuit configured to detect non-data information; (b) a zero-fill circuit configured to replace at least a portion of the non-data information with a zero-pad vector; and (c) an error detection circuit configured to (i) detect a transmission error in data portions of the information and a zero-padded data portion of the information, the data portions and the zero-padded data portion having a first fixed bit length, and (ii) combine the zero-pad vector with a remaining data portion of the information to form the zero-padded data portion. The architectures and/or systems generally comprise those that include a circuit embodying one or more of the inventive concepts disclosed herein or that are configured to practice one or more of the inventive methods or processes described herein.

The present invention advantageously provides CRC circuitry and a CRC architecture with maximum operational and functional circuit area efficiencies, thereby providing increased network speed, smaller chip and IC package sizes, and reduced power consumption, thereby enabling smaller board designs and reduced power consumption and heat generation in systems containing circuitry implementing the present invention.

These and other advantages of the present invention will become readily apparent from the detailed description of preferred embodiments below.

DETAILED DESCRIPTION OF THE PREFERRED EMBODIMENTS

Figure 1:
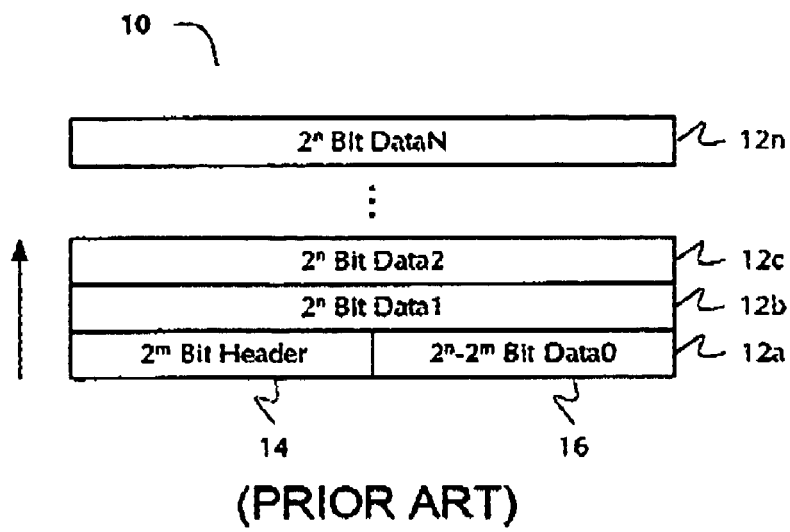
FIG. 1 is a diagram showing a conventional data packet for a network.
Figure 2:
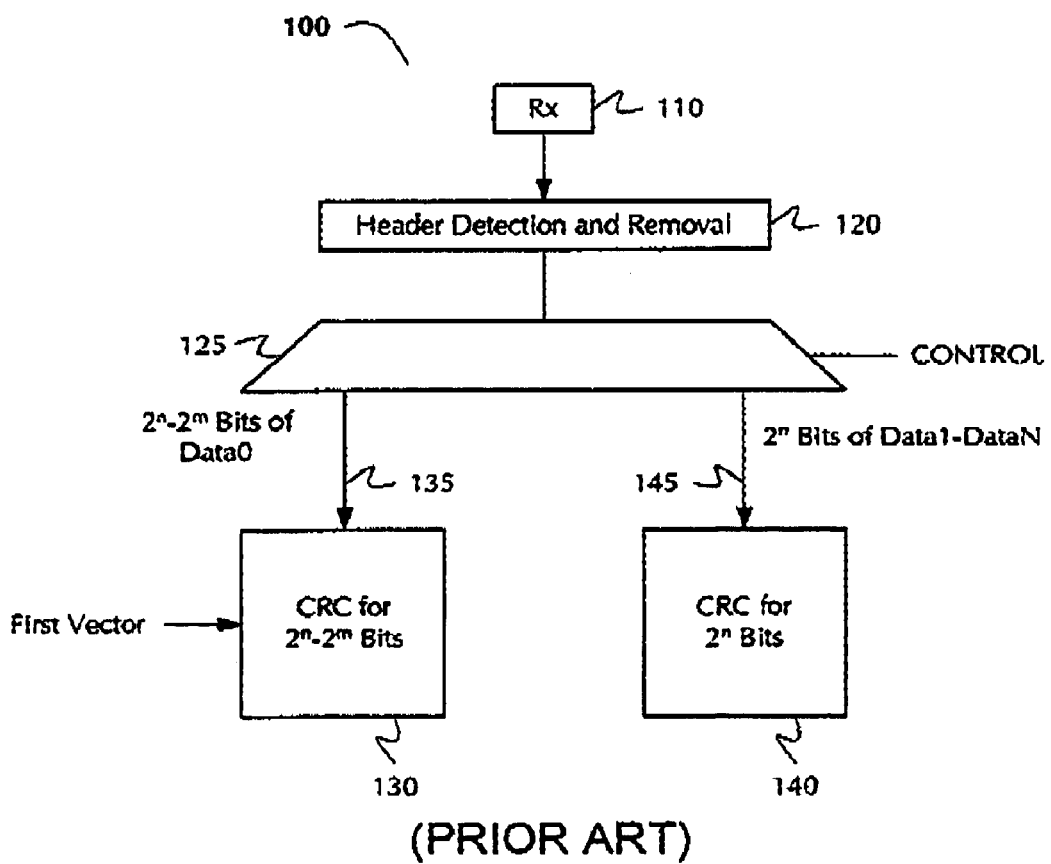
FIG. 2 is a diagram showing an embodiment of a conventional CRC architecture.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the present invention.

Some portions of the detailed descriptions which follow are presented in terms of processes, procedures, logic blocks, functional blocks, processing, and other symbolic representations of operations on data bits, data streams or waveforms within a computer, processor, controller and/or memory. These descriptions and representations are generally used by those skilled in the data processing arts to effectively convey the substance of their work to others skilled in the art. A process, procedure, logic block, function, operation, etc., is herein, and is generally, considered to be a self-consistent sequence of steps or instructions leading to a desired and/or expected result. The steps generally include physical manipulations of physical quantities. Usually, though not necessarily, these quantities take the form of electrical, magnetic, optical, or quantum signals capable of being stored, transferred, combined, compared, and otherwise manipulated in a computer or data processing system. It has proven convenient at times, principally for reasons of common usage, to refer to these signals as bits, waves, waveforms, streams, values, elements, symbols, characters, terms, numbers, or the like.

It should be borne in mind, however, that all of these and similar terms are associated with the appropriate physical quantities and are merely convenient labels applied to these quantities. Unless specifically stated otherwise and/or as is apparent from the following discussions, it is appreciated that throughout the present application, discussions utilizing terms such as "processing," "operating," "computing," "calculating," "determining," "manipulating," "transforming," "displaying" or the like, refer to the action and processes of a computer or data processing system, or similar processing device (e.g., an electrical, optical, or quantum computing or processing device), that manipulates and transforms data represented as physical (e.g., electronic) quantities. The terms refer to actions, operations and/or processes of the processing devices that manipulate or transform physical quantities within the component(s) of a system or architecture (e.g., registers, memories, other such information storage, transmission or display devices, etc.) into other data similarly represented as physical quantities within other components of the same or a different system or architecture.

Furthermore, for the sake of convenience and simplicity, the terms "clock," "time," "rate," "period" and "frequency" are generally used interchangeably herein, but are generally given their art-recognized meanings. Also, for convenience and simplicity, the terms "data," "data stream," "waveform" and "information" may be used interchangeably, as may the terms "connected to," "coupled with," "coupled to," "communicatively coupled to," and "in communication with;" "circuit," "architecture," "circuit block" and "function(al) block;" and the terms "determine," "detect," "calculate," "check" and "find" (and grammatical variations thereof), but these terms are also generally given their art-recognized meanings. The acronym "CRC" refers to cyclic redundancy code, a cyclic redundancy check (e.g., the result of performing a cyclic redundancy code calculation, or the performance of such a calculation) and/or the act of calculating cyclic redundancy code or performing a cyclic redundancy check (sometimes known as "cyclic redundancy checking"), depending on the context of its use.

The present invention concerns methods of determining transmission errors in digital information. The method generally comprises (1) receiving the digital information comprising a plurality of data portions and at least one non-data portion; (2) removing the at least one non-data portion; and (3) if the digital information does not include a data remainder having a length less than the fixed length, then checking the plurality of data portions for a transmission error; but if the digital information includes a data remainder, then adding a zero-pad vector to the remainder to generate a zero-padded data portion having the fixed length, and checking the plurality of data portions and the zero-padded data portion for a transmission error.

A further aspect of the invention concerns a circuit and/or architecture for determining transmission errors in serial information, generally comprising (a) a first logic circuit configured to detect non-data information; (b) a zero-fill circuit configured to replace at least a portion of the non-data information with a zero-pad vector; and (c) an error detection circuit configured to (i) detect a transmission error in data portions of the information and a zero-padded data portion of the information, the data portions and the zero-padded data portion having a first fixed bit length, and (ii) combine the zero-pad vector with a remaining data portion of the information to form the zero-padded data portion.

Even further aspects of the invention concern a system for determining transmission errors in digital information, generally comprising the present circuit and/or architecture, and software configured to implement and/or encode one or more of the methods disclosed herein. The invention, in its various aspects, will be explained in greater detail below with regard to exemplary embodiments.

An Exemplary Method of Cyclic Redundancy Checking

In one aspect, the present invention relates to a method of checking digital information for a transmission error. The method generally comprises the steps of (i) receiving digital information comprising data and at least one non-data portion, the data comprising a plurality of data portions having a fixed first length, (ii) removing the at least one non-data portion, and (iii) if the data does not include a remainder having a length less than the first length, then checking the plurality of data portions for a transmission error; but if the data includes such a remainder, then adding a zero-pad vector to the remainder to generate a zero-padded data portion having the first length, and checking the plurality of data portions and the zero-padded data portion for a transmission error. In preferred embodiments, the digital information comprises serial digital information.

The digital information preferably is transmitted in units and has a unit format that is conventionally used for data transmissions, such as a packet, a frame or a page. Naturally, the digital information may comprise a series or plurality of such data units, but the method is generally performed on an individual unit (and ideally, on each such unit).

Figure 3:
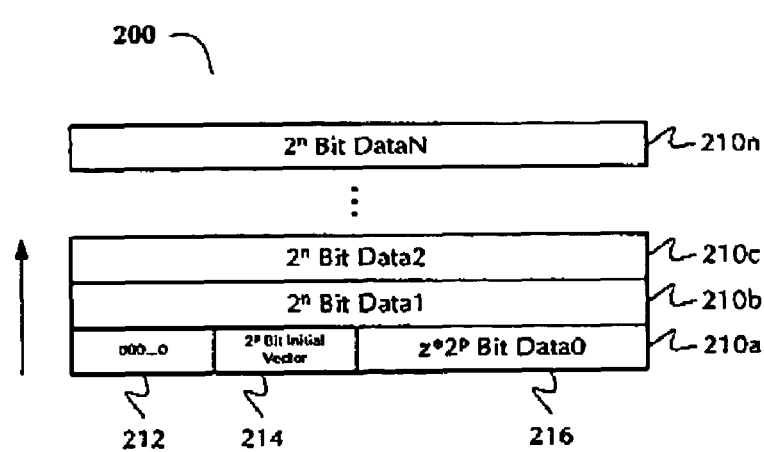
FIG. 3 is a diagram showing a preferred implementation of a data packet structure for the present invention.

Referring now to FIG. 3, a unit of digital information 200 is shown, comprising a zero-padded data line 210a. Each of data lines 210b-210n has a fixed length. In the embodiment shown in FIG. 3, this fixed length is $2^n$ bits, where n is preferably an integer of from 3 to 10, more preferably of from 5 to 8. In one implementation, n is 7. Zero-padded data line 210a comprises a zero fill portion 212, an initial vector 214 and a data portion 216. Initial vector 214 is generally a vector that has a known effect on the CRC calculation. For example, initial vector 214 is typically the CRC transmitted with the data (the known effect of which is to yield the same vector as the result of performing a subsequent CRC) or an "all ones" vector. Initial vector 214 preferably has a known length, for example of $2^p$ bits, where p is preferably an integer of from 2 to 8, more preferably of from 3 to 6. In one implementation, p is 5. Because zero fill portion 212 is transparent to a CRC calculation (i.e., it has no effect, in that a present n-bit CRC state plus a subsequent CRC on an n-bit "all zeros" vector equals the present n-bit CRC state), zero fill portion 212 and initial vector 214 are interchangeable. Data portion 216 generally comprises the remainder of the transmitted data, after accounting for all fixed length data lines 210b-210n. Zero fill portion 212 will be explained in greater detail below.

As described above, one disadvantage of conventional CRC methods and circuits is that separate circuits are used to perform CRC calculations on data blocks of different sizes. That can be a very inefficient process, but has generally been necessary in order to process units of data having a bit length that is not a multiple of $2^n$. However, in one aspect, the present invention involves a method for performing CRC calculations on blocks of data having a uniform bit length, thereby enabling CRC on digital data using a single CRC circuit or circuit block. Generally, the present invention processes digital information in portions having a known and/or fixed length (e.g., data lines 210b-210n in FIG. 3), removes one or more non-data portions of the digital information and/or replaces it with one or more known vectors (e.g., a predefined first vector) that do not affect the CRC calculation, and to the extent necessary, adds a sufficient number of bits having digital zero values (the "zero-pad vector" 212) to generate a final, zero-padded data portion having the known and/or fixed length (e.g., line 210a in FIG. 3). Thus, the present method may further comprise inserting a replacement vector comprising a known vector and/or the zero-pad vector for a non-data portion of the digital information.

In one preferred embodiment, the digital information may comprise a packet. As is known in the art, depending on the application, packets may have a variable length or a fixed length. Packets suitable for use in the present invention preferably comprise $(2^x \cdot y)+z$ words, wherein $2^x$ is the number of words in a line of information in the packet, x is an integer of from 0 to 4 (preferably from 1 to 3, and in one embodiment, 2), y is the number of lines of information in the packet (generally $\geq 1$, preferably $\geq 3$, more preferably $\geq 5$, and most preferably $\geq 7$), and z is an integer of less than $2^x$. A data word generally comprises four (4) bytes of data, but the number of data bytes that make up a data word may vary, depending on the application.

In a preferred implementation, the packets have a fixed length, in which case y and z are both constant values from packet to packet. When y and z are constant, the same known vector and the same known length of zero filling can be inserted into the zero-padded data portion for each packet. When constant values for y and z are known at or before the time of circuit design, the known vector and the known zero fill portion can be implemented in hardware.

Where packets may have a variable length, the number of excess data words, excess data bytes and/or excess bits (i.e., those words, bytes and/or bits that are not present in sufficient number to complete the next higher unit of length) in the packet may be determined, and an appropriate vector containing a sufficient number of zero-fill bits to complete the zero-padded data portion may be generated or selected based on the determination. For example, a conventional look-up table can be employed to store vectors of various zero-fill bit lengths, and the addresses of the look-up table can be correlated to the outcome of the excess data word, byte and/or bit determination. For example, in an application where data is known to be transmitted in words only, the excess number of words can be determined (e.g., 0, 1, 2, . . . $2^x-1$) and a complementary number of all-zero words can be added to the excess data words to form a complete, zero-padded data line.

Figure 4:
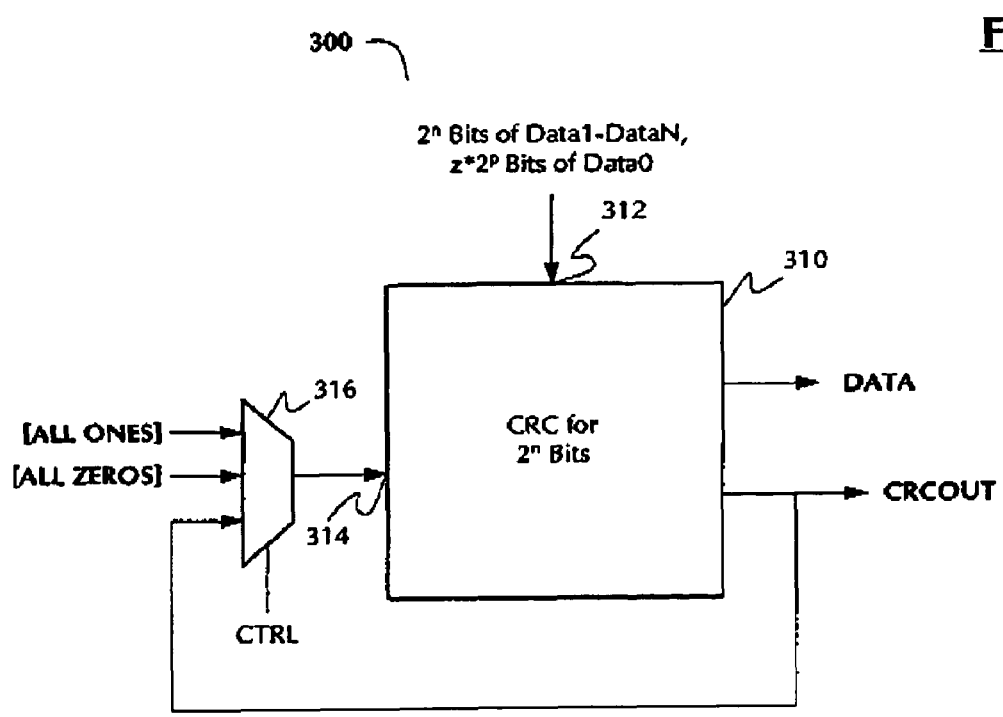
FIG. 4 is a diagram showing an exemplary embodiment of the present CRC architecture.

For example, referring now to FIG. 4, an exemplary CRC circuit 300 is shown. Typically, every clock cycle, CRC circuit 300 receives (i) $2^n$ bits of data and (ii) a "CRC calculation" vector. While CRC circuit 300 receives and processes $2^n$ bits of data at a time, the CRC itself is generally $2^p$ bits long. At a first input 312, CRC block 310 receives data lines 210b-210n, each having a bit length of $2^n$ bits, and data portion 216 having a bit length of $z \cdot 2^p$ bits. At a second input 314, block 300 receives one of a predefined first vector ALL ONES, a zero-fill vector ALL ZEROS or the previous CRC result CRCOUT, depending on the state of a control signal CTRL. The state of the control signal CTRL is determined by logic (not shown) that instructs multiplexer or switch 316 to select (i) first vector ALL ONES on the first clock cycle of a new CRC calculation, (ii) zero-fill vector ALL ZEROS when the data packet length is such that a number of binary zero value bits are needed to fill data line 210a (see FIG. 3), or (iii) the CRC on the previous $2^n$ bits of data, once a CRC on $2^n$ bits of data (including the $2^n$ bits of zero-padded data line 210a) has been calculated. This control logic may generate control signal CTRL in response to appropriate signals from a decoder or receiver circuit configured to detect and/or process non-data information (see, e.g., the discussion of FIGS. 5-7 below). In the first clock cycle, CRC block 310 receives and calculates a CRC on data portion 216 having a bit length of $z \cdot 2^p$ bits, the ALL ONES vector (the selected "CRC calculation" vector described above) and, to the extent needed to fill data line 210a (see FIG. 3), zero-fill vector ALL ZEROS. In subsequent cycles, CRC block 310 receives and calculates a CRC on the CRC output CRCOUT (the selected "CRC calculation" vector for these cycles) and the next $2^n$ bits of data. Once the CRC has been calculated on all of the data, the CRC output CRCOUT may be read or received by other functional blocks (see, e.g., FIGS. 5-7 and the description thereof below) for incorporation into the information stream. CRC block 300 may also receive an optional data/vector input INPUT at a third input 318 (e.g., if one opts not to zero-pad the DATA0 line 210a [see FIG. 3] or to use a vector other than predefined first vector ALL ONES or zero-fill vector ALL ZEROS). When the length of the data is known at the time of design, predefined first vector ALL ONES may be selected and processed by CRC block 310 in response to a predetermined state of control signal CTRL generated from an appropriately configured counter; otherwise, the predetermined state of control signal CTRL that selects predefined first vector ALL ONES may be generated in response to, e.g., appropriate signals from a decoder or receiver circuit configured to detect and/or process non-data information as discussed above and/or below. CRC block 310 is configured to calculate a CRC on $2^n$-bit data. As a result, CRC block 310 is also generally configured to add the ALL ZEROS vector (corresponding to zero fill portion 212) and/or predefined vector 214 to the $z \cdot 2^p$ bits of data portion 216, thereby forming a $2^n$-bit zero-padded data line 210a that can be processed by $2^n$-bit CRC block 310. Thus, in the present method, one of the data portions of the digital information may have a length consisting of a difference between the fixed length of a data line and the fixed length of the non-data portion of the digital information.

The predefined vector is not limited to an "all ones" vector, nor is the zero-fill vector limited to an "all zeroes" vector. However, the relationship between the predefined vector and the zero-fill vector is generally such that the net effect of adding these vectors to the data portion for error checking cannot affect the outcome of the error checking operation. For example, if one performs a CRC calculation on (1) the transmitted CRC vector, (2) the predefined vector and (3) the zero-fill vector, one should obtain the transmitted CRC vector.

Thus, in a preferred implementation of the inventive method, the non-data portion may comprise a packet header having a length less than or equal to the fixed length of the packet, more preferably less than the fixed length of the packet. The packet header length may be variable or fixed, but preferably, is fixed. In preferred embodiments, the fixed packet length is $2^m$ bits, where m is an integer of from 3 to 7. In one implementation, m is 5. In preferred implementations, the packet header conforms to a conventional network protocol and/or protocol stack, such as OSI, ASN.1 (Abstract Syntax Notation 1), BER (Basic Encoding Rules), CMIP (Common Management Information Protocol), CMIS (Common Management Information Services), X.400 (Message Handling System, or MHS), X.500 (Directory Service), ANSI/NISO Z39.50, TCP, IP and/or TCP/IP. The packet header may include a start-of-packet (SOP) sequence, source and/or destination addresses, and/or information on the packet format and/or amount of data (e.g., the number of data words) in the packet. However, in the context of the present invention, any CRC that is appended to and/or transmitted with a data packet (a "transmitted CRC vector") is generally considered part of the data packet, and not part of the packet header. To the extent the transmitted CRC vector is not part of a continuous stream with the transmitted data, the present invention further relates to process steps and/or circuitry that detects and/or isolates the transmitted CRC vector and appends or inserts the transmitted CRC vector to the data (preferably to the remainder).

In a further embodiment, the present method may further comprise removing the packet header and inserting a series of binary zero bits having a bit length equal to that of the packet header (or the non-data portion, in a more general sense). In a preferred embodiment where the digital information comprises a packet, the combination of one of the data portions and the series of binary zeros (and, optionally, the known vector) has the first fixed length, all remaining data portions of the packet have the first fixed length, and the checking step comprises checking each of the data portions with common circuitry.

In the present method, the checking step may comprise any conventional error detection process or technique, such as CRC or a "checksum" operation. Preferably, checking data for a transmission error comprises performing a cyclic redundancy checking (CRC) operation. The present method may also further comprise acknowledging receipt of the information upon or in response to determining that there was no error in the data portions of the information (e.g., by issuing a conventional ACK command or signal when the CRC calculated from the data portions of the information matches the CRC in the non-data portion of the information), not acknowledging receipt and/or requesting retransmission of the information upon or in response to determining that there was an error in the data portions of the information (e.g., by doing nothing or by issuing a conventional NAK [negative acknowledge] command or signal when the CRC calculated from the data portions of the information does not match the CRC in the non-data portion of the information), reassembling the data packet after the CRC calculation, etc.

An Exemplary Circuit and Architecture

A further aspect of the invention relates to a circuit and architecture for determining an information transmission error, comprising (a) a first logic circuit configured to detect non-data information; (b) a zero-fill circuit configured to replace at least a portion of the non-data information with a zero-pad vector; and (c) an error detection circuit configured to (i) detect a transmission error in data portions of the information and a zero-padded data portion of the information, the data portions and the zero-padded data portion having a first fixed bit length, and (ii) combine the zero-pad vector with a remaining data portion of the information to form the zero-padded data portion. As explained above, the data portions and the zero-padded data portion of the information generally have a common (i.e., the same) bit length. This feature enables a single CRC circuit to calculate a CRC on data of any length, thereby reducing the chip area dedicated to CRC, increasing the utilization efficiency of the circuitry on the chip, and reducing power consumption. Thus, another preferred embodiment of the present circuit and/or architecture is one in which the error detection circuit comprises a cyclic redundancy checking (CRC) circuit. More preferably, the common bit length of the data portions and the zero-padded data portion of the information is $2^n$ bits, where n is an integer of from 3 to 10, even more preferably from 5 to 8. In one implementation, n is 7.

In a preferred application, the information received and/or processed by the present circuit comprises a plurality of packets. Preferably, each of the packets has a first fixed length, and the non-data portion comprises a packet header having a second length (which may be variable or fixed) less than or equal to the first fixed length. In preferred embodiments, the packet header has the second fixed length, and the second fixed length is less than the first fixed length. The second fixed length may consists of $2^m$ bits, where m is an integer of from 3 to 8, preferably 4 to 7, and in one implementation, m is 5.

Figure 5:
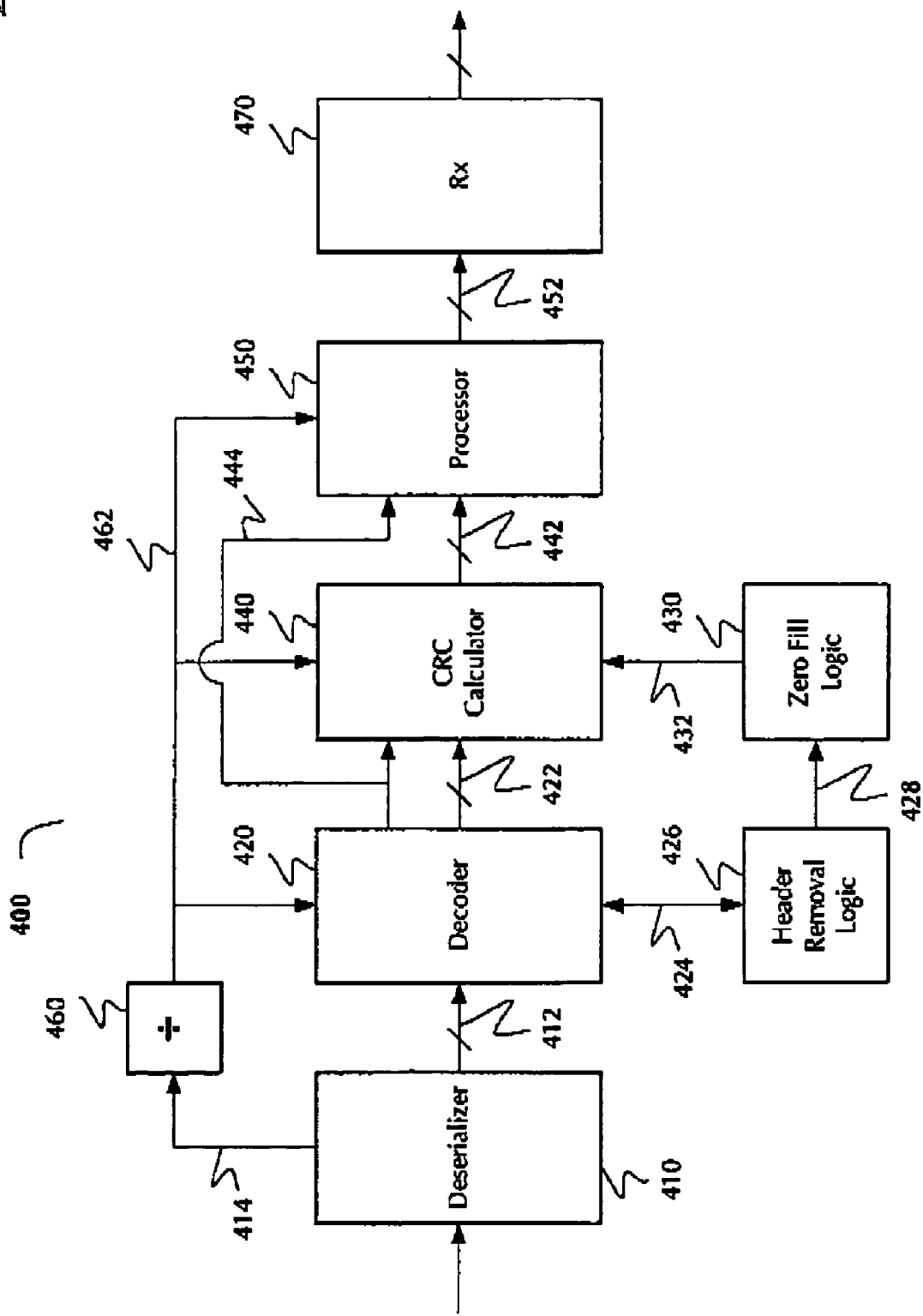
FIG. 5 is a box level diagram of an exemplary receiver architecture, embodying the present invention.

FIG. 5 shows a block diagram of an architecture and/or circuit suitable for use as a receiver implementing the present invention. Receiver 400 comprises a deserializer 410, a decoder 420, header removal logic 426, zero fill logic 430, CRC calculator 440, processor 440 and receiver functional block 470. Receiver 400 may further comprise a divider 460 configured to divide a clock signal recovered from serial information received by the receiver 400, typically by a clock recovery circuit located in the deserializer 410 (as shown in FIG. 5) or elsewhere in the receiver 400.

Deserializer 410 is generally configured to convert serial digital information received by the receiver 400 into parallel information for processing by downstream circuitry, such as decoder 420, header removal logic 426, zero-fill circuit 430 and CRC circuit 440. Thus, the present circuit may further comprise a deserializer configured to convert serial information into parallel information for processing by the non-data information detection circuit and the error detection circuit.

The present circuit may further comprise a decoder configured to decode at least part of the non-data information. In certain embodiments, the non-data information comprises a header, and in other embodiments, a header and a trailer. For example, when the non-data information comprises a packet, the non-data information generally comprises a packet header, and when the non-data information comprises a frame, the non-data information generally comprises a frame header and a frame trailer.

As described above, in some applications, the header includes non-data information such as a start-of-packet (SOP) or start-of-frame (SOF) sequence, source and/or destination addresses, and/or information on the format and/or amount of data in the information block (e.g., packet or frame). The decoder is generally configured to perform a number of identification, detection and/or decoding functions, such as detect a SOP and/or SOF sequence, determine the format of the information block, determine the amount of data (e.g., in lines, words, bytes and/or bits) in the information block, and decode source and/or destination addresses. For example, referring to FIG. 5, decoder 420 may receive parallel information from deserializer 410 on bus 412 (which may be $2^p$ bits wide, where p is as described above), decode a destination address, then send an appropriate single- or multi-bit signal to receiver block 470 for appropriate routing of the information through receiver 400 towards the desired (e.g., predefined and/or predetermined) destination. The trailer typically contains an end-of-frame (EOF) sequence, and possibly information relating to the quality of the data (e.g., whether or not errors were identified in the data, what kind of error, and/or where the error may have been introduced), the priority of the information, the reliability of the data source, or other "tag" type of information relating to the quality and/or reliability of the data, its source and/or its transmission(s) through the network.

Upon detection of non-data information (e.g., a SOP or SOF sequence), decoder 420 also transmits an appropriate control signal to header removal block 426 along bus 424, which may be single-bit or multi-bit, bidirectional or comprised of two (or more) unidirectional busses. Header removal logic 426 sends a first control signal back to decoder 420 to not send non-data information to CRC calculator 440, and a second control signal along bus 428 (which may be single- or multi-bit, and is preferably multi-bit when zero fill logic 430 includes a look-up table) to zero fill logic 430, which then transmits to CRC calculator 440 (i) a zero-pad vector of appropriate length and/or (ii) the known, predefined vector that may initiate and/or that does not affect the CRC calculation. Decoder 420, header removal logic 426 and/or zero fill logic 430 (preferably decoder 420) also sends to CRC calculator 440 a control signal configured to instruct CRC calculator 440 to select the appropriate vector from either parallel bus 422 (i.e., data portions 216 and 210b-210n from decoder 420) or bus 432 (i.e., zero-pad vector and/or the predefined vector from zero fill logic 430) for the CRC calculation. Bus 432 may be serial or parallel.

Thus, the circuit may also further comprise (i) a second logic circuit configured to remove the portion of the non-data information and insert the zero-padded data for the portion of the non-data information, and/or (ii) a deserializer configured to convert serial information into parallel information for processing by the non-data information detection circuit and the error detection circuit, wherein the decoder is further configured to decode at least part of the parallel information. It is well within the abilities of one skilled in the art to design and use logic configured to remove from a serial or parallel data stream non-data information that has been identified as such, and insert the zero-padded data (or any other vector, for that matter) for the non-data information.

CRC calculator 440 is configured to perform a conventional CRC operation, but generally on data having a single, uniform bit length (or, more literally, width, if performed on parallel data). Thus, CRC calculator 440 typically includes only a single CRC calculating circuit configured to calculate a CRC on data of a fixed bit length/width, preferably where the fixed bit length/width is $2^n$ bits, where n is an integer of from 3 to 10, more preferably from 5 to 8. CRC calculator 440 is also generally configured to determine whether the CRC it calculates matches the CRC transmitted with the information to receiver 400. Generally, in the implementation of FIG. 5, the data portions 210b-210n and 216 of the digital information, the CRC calculated by CRC calculator 440 and a signal indicating whether the calculated CRC matches the transmitted CRC or not are all output from CRC calculator 440 to processor 450 along parallel bus 442 either $2^p$ or ($2^p$+1) bits at a time (where the extra bit indicates whether the calculated CRC matches the transmitted CRC).

The present circuit and/or architecture may further comprise a processor configured to process the data portions of the information received from the error detection circuit. Processor 450 is generally configured to perform any conventional data processing operation on either or both of the data portions and the non-data portions of the digital information, such as data filtering, signal equalizing, bit width adjusting, etc. In one embodiment, the processor is further configured to reassemble the packet header and the data portions of the information. In such an embodiment, the header information removed from the packet in decoder 420 will be transmitted to processor 450 on bus 444, which may be a single- or multi-bit bus.

After processing the information received from CRC calculator 440 and/or decoder 420, the information is output on parallel bus 452 to receiver block 470. Receiver block 470 is conventional, and is generally configured to perform conventional receiver functions, such as data buffering, data signal routing, data signal switching, etc. When configured to buffer data, the receiver block 470 may comprise a conventional first-in-first-out (FIFO) memory or a conventional memory controller. When configured to route or switch data signals, the receiver block 470 may comprise a conventional switch array or crossbar array.

Figure 6:
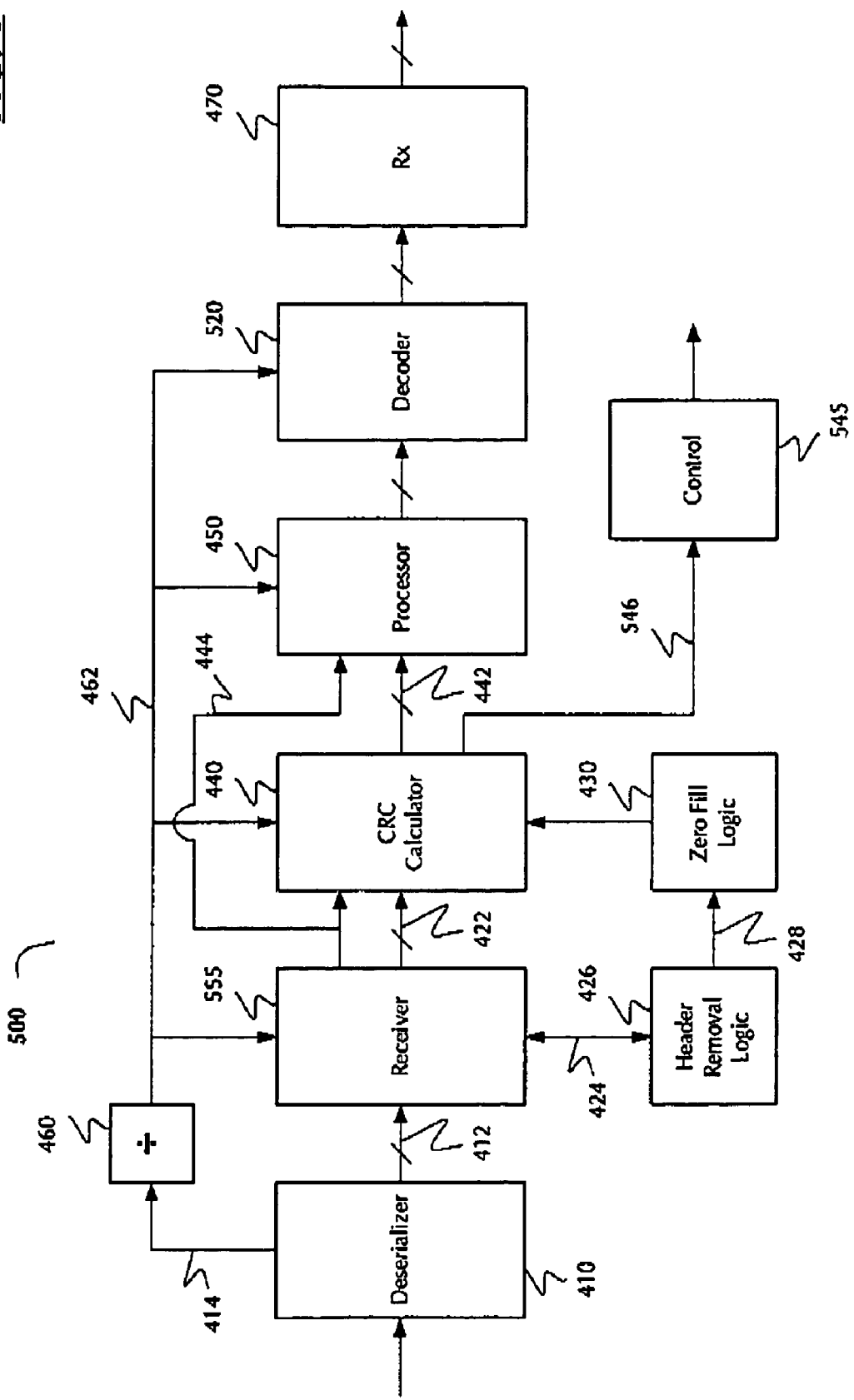
FIG. 6 is a box level diagram of a second exemplary receiver architecture, embodying the present invention.

FIG. 6 shows a second embodiment of a receiver architecture 500 configured to implement the present invention, with a few changes. Notably, decoder 520 is relocated downstream from processor 450, and thus, receives an output from processor 450 as an input. However, decoder 520 generally performs the same or similar functions as decoder 420 in FIG. 5, except for functions that are allocated to receiver block 555.

Receiver block 555 now receives deserialized information on parallel bus 412 from deserializer 410. However, the function(s) of receiver block 555 are somewhat simplified relative to decoder 420 (see FIG. 5 and the description above). Receiver block 555 is generally configured to detect SOP and/or SOF sequences and/or CRC information, exchange information with and/or receive instruction(s) from header removal logic 426, remove non-data information from the data stream to enable CRC calculator 440 to perform a CRC calculation on the data, and transmit non-data information to processor 450. However, receiver block 555 generally does not decode certain information, such as source and destination addresses, information format and/or transmission protocol, etc. Such functions are reserved for the decoder 520.

FIG. 6 also includes a control block 545 that receives information and/or instructions from CRC calculator 440 on bus 546 (which may be single- or multi-bit). In its simplest embodiment, CRC calculator 440 sends a single-bit status signal on bus 546 to control block 545, to indicate whether the calculated CRC matches the transmitted CRC (wherein the status signal has a first predetermined state) or not (wherein the status signal has a second predetermined state). When the calculated CRC matches the transmitted CRC, it is an indication that the error detection circuit detected no error in the data portions of the information, including the zero-padded data portion, and control block 545 may transmit one or more control signals to other circuitry, enabling such other circuitry to perform predefined functions and/or operations. When the calculated CRC does not match the transmitted CRC, it is an indication that the error detection circuit detected an error in the transmitted data portions of the information, and control block 545 may transmit one or more control signals (which may be discrete control signals or may be a different state of the same control signal) to other circuitry, either (i) disabling some or all of such other circuitry and/or (ii) instructing some or all of such other circuitry to perform one or more different predefined functions and/or operations.

Thus, in further embodiments, the present circuit may further comprise a control circuit configured to transmit a control signal in response to an error in any of the data portions of the information detected by the error detection circuit. For example, the control circuit may be configured to transmit (i) a first control signal in response to the error detection circuit detecting an error in the data portions and the zero-padded data portion of the information, and (ii) a second control signal in response to the error detection circuit detecting no error in the data portions and the zero-padded data portion of the information. For example, control circuit 545 may (a) generate a conventional ACK signal and transmit the same to the external information transmitter to acknowledge receipt of the information in response to CRC calculator 440 determining that there was no error in the data portions of the information (e.g., when the calculated CRC matches the transmitted CRC); (b) do nothing or transmit a conventional NAK signal to the external information transmitter to indicate that the transmitted data may be corrupted and/or to request retransmission of the information in response to CRC calculator 440 determining that there was an error in the data portions of the information (e.g., when the calculated CRC does not match the transmitted CRC); (c) instruct processor 450 to reassemble the data packet after the CRC calculation and/or instruct receiver block 470 to buffer and/or route the data, etc.

Figure 7:
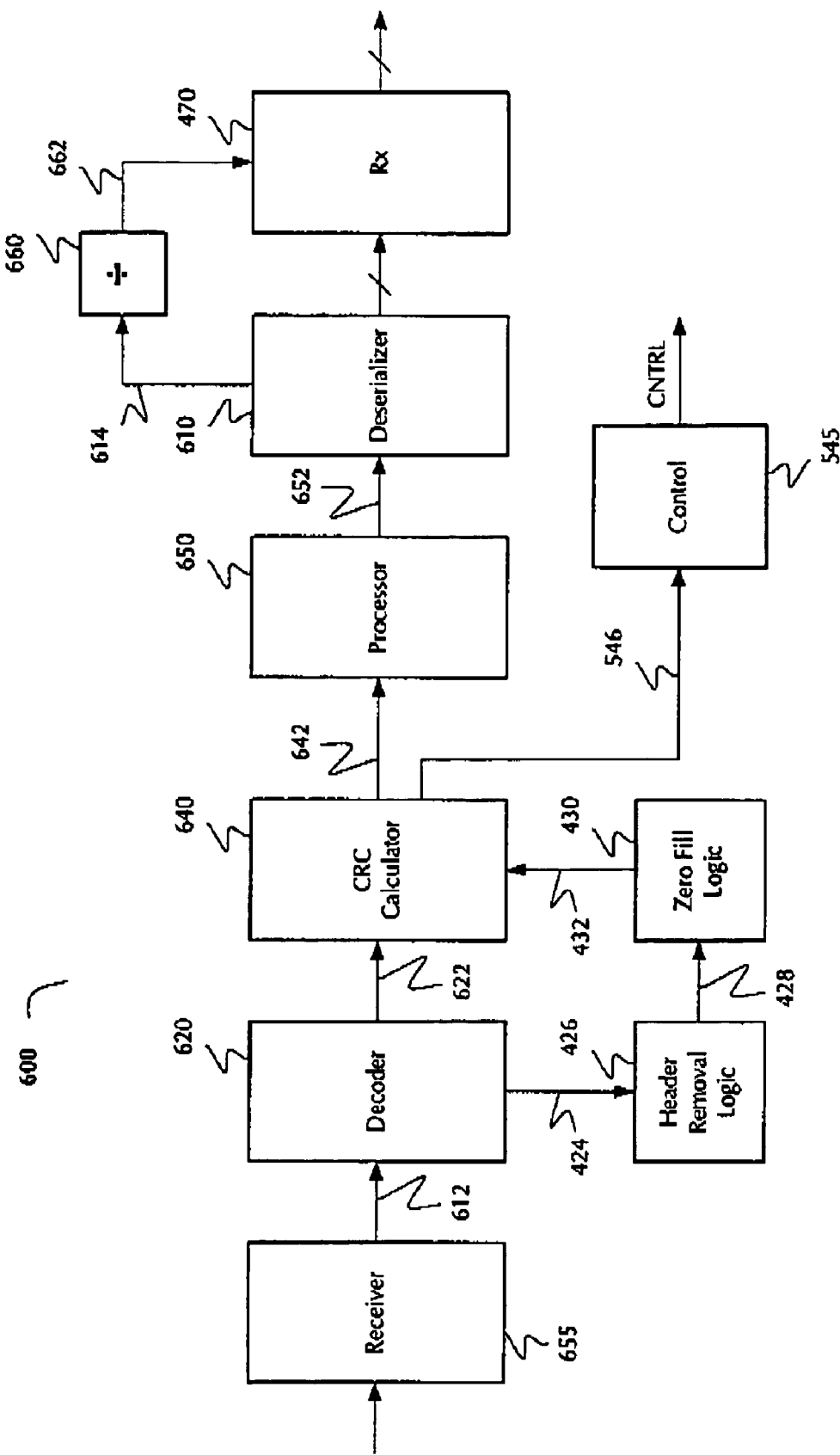
FIG. 7 is a box level diagram of a third exemplary receiver architecture, embodying the present invention.

FIG. 7 shows yet another embodiment of a receiver architecture 600 in which the decoder 620 may be configured to receive (and/or decode and/or otherwise process) serial information. This architecture is essentially the same as that of FIG. 6, but in which busses 612, 622, 642 and 652 are serial, rather than parallel, and in which decoder 620, CRC calculator 640 and processor 650 operate on serial data or serial information, rather than parallel data or parallel information. Such circuit blocks are conventional and known to those skilled in the art. However, it is worth noting again that serial CRC calculator 640 generally contains only a single CRC calculating circuit that operates on data units having a uniform, consistent and/or common bit length.

Exemplary Software

Although the description herein tends to focus on methods and hardware (e.g., architectures, systems and/or circuits), the present invention also includes a computer program and/or software, implementable and/or executable in a general purpose computer or workstation equipped with a conventional digital signal processor, configured to perform one or more steps of the method and/or one or more operations of the hardware. Thus, a further aspect of the invention relates to software that implements the above method and/or algorithm. For example, the invention may further relate to a computer program, computer-readable medium or waveform containing a set of instructions which, when executed by an appropriate signal processing device, is configured to perform the above-described method and/or algorithm.

For example, the computer-readable medium may comprise any medium that can be read by a signal processing device configured to read the medium and execute code stored thereon or therein, such as a floppy disk, CD-ROM, magnetic tape or hard disk drive. Such code may comprise object code, source code and/or binary code.

The waveform is generally configured for transmission through an appropriate medium, such as copper wire, a conventional network cable, a conventional optical data transmission cable, or even air or a vacuum (e.g., outer space) for wireless signal transmissions. The waveform and/or code are generally digital, and are generally configured for processing by a conventional digital data processor (e.g., a microprocessor, microcontroller, or logic circuit such as a programmable gate array, programmable logic circuit/device or application-specific [integrated] circuit).

The System and Network

A further aspect of the invention concerns a receiver, comprising the present circuit and/or architecture; a processor in communication with the circuit and/or architecture, configured to process the data portions; and a clock recovery circuit configured to recover a clock signal from serial information received by the receiver. In preferred embodiments, the receiver is embodied on a single integrated circuit.

In further embodiments, the receiver further comprises a divider configured to divide the recovered clock. For example, each of FIGS. 5 and 6 show a divider 460 configured to receive a recovered clock 414 from deserializer 410 and provide a divided clock signal 462 to receiver functional blocks downstream from deserializer 410 (e.g., decoder 420, CRC calculator 440 and processor 450 in FIG. 5). FIG. 7 shows a similar divider 660, configured to receive a recovered clock 414 from deserializer 410 and provide a divided clock signal 462 to receiver functional blocks downstream from deserializer 410 (e.g., decoder 420, CRC calculator 440 and processor 450). The value by which a divider divides a recovered clock may be a fraction of any integer of 1 or more divided by any integer of 2 or more. Generally, the divided clock signal has a frequency suitable for operation of the downstream functional blocks (e.g., from 50 to 500 MHz, typically about 75, 83, 100, 125, 133, 166, 200, 233, 250 or 266 MHz).

A further aspect of the invention concerns a system for transferring data on or across a network. The system generally comprises the present receiver; at least one transmitter in communication with the receiver, the transmitter being configured to transmit the serial information to the receiver; and at least one receiver port in communication with the receiver for receiving the serial information.

Figure 8:
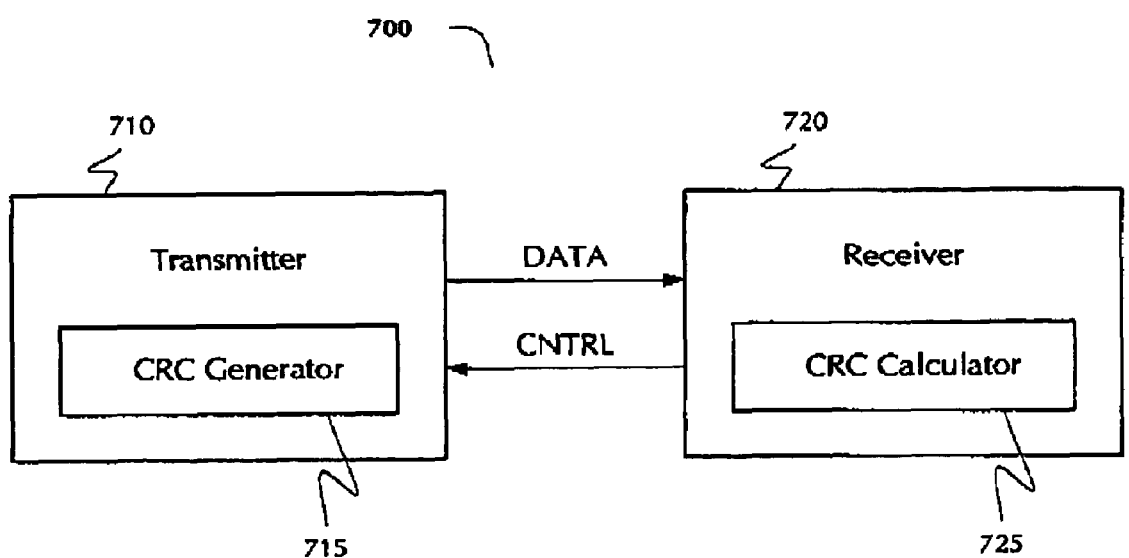
FIG. 8 is a box level diagram of an exemplary system configured to employ the present invention.

For example, and referring now to FIG. 8, a system 700 implementing the present invention may comprise a transmitter 710, a receiver 720, and at least two busses therebetween: (1) a serial information transmission bus DATA from transmitter 710 to receiver 720, and (2) a unidirectional control bus CNTRL from receiver 720 to transmitter 710. While the serial information bus DATA is generally single bit and unidirectional, control bus CNTRL may be single bit or multi-bit, and may be serial or parallel. As is known to those skilled in the art, transmitter 710 further includes a CRC generator 715, which generally comprises a conventional CRC calculating circuit (and which may comprise the error detection circuit described above) and a further circuit configured to append or insert a CRC generated on a unit of data by CRC generator 715 to the unit of data to be transmitted by transmitter 710 to receiver 720. Similarly, receiver 720 (which generally comprises the receiver circuitry and/or architecture described above) further includes a CRC calculator 725, which generally comprises the error detection circuit described above and further circuitry configured to remove the CRC generated by CRC generator 715 and compare it to the CRC calculated by the error detection circuit in CRC calculator 725. As described above, depending on whether the calculated CRC matches the generated CRC, a control signal (e.g., CNTRL) may be transmitted to transmitter 710 to either acknowledge receipt of an uncorrupted data unit (calculated CRC matches) or request retransmission of corrupted data (calculated CRC does not match). Thus, in preferred embodiments of the present system, the transmitter further comprises (i) a CRC generator configured to calculate CRC information, and/or (ii) a transmitter processor configured to add the CRC information to or insert the CRC information in the non-data information; the receiver may further comprise a control circuit configured to generate the control signal in response to the error detection circuit detecting (i) an error in the data portions and the zero-padded data portion of the information, and/or (ii) no error in the data portions and the zero-padded data portion of the information; and/or the system may further comprise a control bus configured to transmit the control signal from the receiver to the transmitter.

In further embodiments, the system may be configured to convert serial data from the network to parallel data for a device, and convert parallel data from the device to serial data for the network. Thus, the system may further include (1) a deserializer as described above, included in the receiver; (2) a serializer (included in the transmitter) configured to convert parallel information from a device including the transmitter to serial information for a network; (3) a decoder as described above, included in the receiver; (4) an encoder (included in the transmitter) configured to encode certain non-data information and append or insert such encoded information to the information to be transmitted onto a network; (5) a data processor in the receiver as described above; and/or (6) a receiver functional block as described above. In a preferred implementation, the receiver in the system further comprises a second transmitter (i.e., the receiver is a transceiver or part of a multiplexer, network switch, repeater, router or SERDES device).

A further aspect of the invention concerns a network, comprising (a) a plurality of the present systems, in communication with each other; and (b) a plurality of storage or communications devices, wherein each storage or communications device is in communication with at least one of the systems. The network may be any kind of known network, such as a storage network (e.g., RAID array), Ethernet, or wireless network, but preferably, the network comprises a storage network. The network may include any known storage or communications device, but preferably, at least a plurality of the coupled devices comprises storage devices.

CONCLUSION/SUMMARY

Thus, the present invention provides a method, circuit, architecture, and system for detecting or determining an error in a data transmission. The method generally comprises (1) receiving the digital information comprising a plurality of data portions and at least one non-data portion; (2) replacing the at least one non-data portion with at least one of a known vector and a zero-pad vector to generate a zero-padded data portion; and (3) checking the plurality of data portions and the zero-padded data portion for a transmission error. The circuit and architecture generally comprise (a) a first logic circuit configured to detect non-data information; (b) a zero-fill circuit configured to replace at least a portion of the non-data information with a zero-pad vector; and (c) an error detection circuit configured to (i) detect a transmission error in data portions of the information and a zero-padded data portion of the information, the data portions and the zero-padded data portion having a first fixed bit length, and (ii) combine the zero-pad vector and/or a predefined vector with a remaining data portion of the information to form the zero-padded data portion. The data portions and the zero-padded data portion of the information have a common, fixed bit length. This feature enables a single error detection circuit to calculate redundant code (such as a CRC or a checksum) on data of any length, thereby reducing the chip area dedicated to error detection, increasing the utilization efficiency of the circuitry on the chip, and reducing power consumption.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A method of checking digital information for a transmission error, comprising the steps of:
   a) receiving said digital information, said digital information comprising a plurality of data portions and a further portion containing data and non-data, each of the data portions and the further portion having a fixed first length;
   b) removing said non-data from the further portion to generate a remainder having a second length less than said fixed first length;
   c) adding a zero-pad vector to said remainder to generate a zero-padded data portion having said fixed first length; and
   d) checking said plurality of data portions and said zero-padded data portion for a transmission error.

2. The method of claim 1, wherein said fixed first length comprises $2^n$ bits, where n is an integer of from 3 to 10.

3. The method of claim 1, wherein said digital information comprises a packet or frame.

4. The method of claim 3, wherein said packet or frame comprises $(2^x \cdot y)+z$ words, wherein $2^x$ is the number of words in a line of information in said packet or frame, x is an integer of from 0 to 4, y the number of lines of information in said packet or frame, and z is an integer of less than $2^x$.

5. The method of claim 3, wherein said non-data comprises a header having a variable or fixed third length, said third length being less than or equal to said fixed first length.

6. The method of claim 5, wherein said removing step comprises removing said header and inserting said zero-pad vector therefor, such that said zero-pad vector has a length equal to that of said removed header.

7. The method of claim 6, wherein said header has a fixed second length, and said fixed second length is less than said fixed first length.

8. The method of claim 7, wherein said fixed second length consists of $2^m$ bits, where m is an integer of from 3 to 8.

9. The method of claim 7, wherein remainder has a length consisting of a difference between said fixed first length and said fixed second length.

10. The method of claim 9, wherein said checking step comprises checking each of said data portions and said zero-padded data portion with common circuitry.

11. The method of claim 1, wherein said digital information comprises serial digital information.

12. The method of claim 1, wherein said checking step comprises calculating cyclic redundancy code (CRC) on all of said data portions and said zero-padded data portion.

13. A computer-readable medium or waveform containing a set of instructions which, when executed by a signal processing device configured to execute computer-readable instructions, is configured to perform the method of claim 1.

14. The computer-readable medium or waveform of claim 13, wherein said digital information comprises a packet or frame.

15. The computer-readable medium or waveform of claim 14, wherein said packet or frame comprises $(2^x \cdot y)+z$ words, wherein $2^x$ is the number of words in a line of information in said packet or frame, x is an integer of from 0 to 4, y the number of lines of information in said packet or frame, and z is an integer of less than $2^x$.

16. The computer-readable medium or waveform of claim 13, wherein removing step comprises removing said non-data and inserting said zero-pad vector therefor, such that said zero-pad vector has a length equal to that of said removed non-data.

17. The computer-readable medium or waveform of claim 13, wherein remainder has a length consisting of a difference between said fixed first length and said second length.

18. The computer-readable medium or waveform of claim 13, wherein said checking step comprises calculating cyclic redundancy code (CRC) on all of said data portions and said zero-padded data portion.

19. A circuit for determining an information transmission error, comprising:
   a) a first logic circuit configured to receive digital information and detect non-data in said digital information, said digital information comprising a plurality of data portions and a further portion containing data and said non-data, each of the data portions and the further portion having a fixed first length;
   b) a zero-fill circuit configured to replace at least a portion of said non-data with a zero-pad vector; and
   c) an error detection circuit configured to (i) combine the data from said further portion with said zero-pad vector to generate a zero-padded data portion having the fixed first length, and (ii) detect a transmission error in the data portions and the zero-padded data portion.

20. The circuit of claim 19, wherein said fixed first length is $2^n$ bits, where n is an integer of from 3 to 10.

21. The circuit of claim 19, wherein said information comprises a packet or frame.

22. The circuit of claim 21, wherein said non-data comprises a header having a variable or fixed second length, said variable or fixed second length being less than or equal to said fixed first length.

23. The circuit of claim 22, wherein said header has said fixed second length, and said fixed second fixed length is less than said fixed first length.

24. The circuit of claim 23, wherein said fixed second length consists of $2^m$ bits, where m is an integer of from 3 to 8.

25. The circuit of claim 19, further comprising a second logic circuit configured to remove said non-data and insert said zero-pad vector for at least part of said non-data.

26. The circuit of claim 19, wherein said error detection circuit comprises a cyclic redundancy checking (CRC) circuit.

27. The circuit of claim 19, further comprising a control circuit configured to transmit a control signal in response to said error detection circuit detecting (i) an error in said data portions and said zero-padded data portion, or (ii) no error in said data portions and said zero-padded data portion.

28. The circuit of claim 19, further comprising a processor configured to process said data portions received from said error detection circuit.

29. The circuit of claim 28, wherein said processor is further configured to reassemble said non-data and said data of said further portion.

30. The circuit of claim 19, further comprising a deserializer configured to convert serial information into parallel information for processing by said first circuit and said error detection circuit.

31. The circuit of claim 19, further comprising a decoder configured to decode at least part of said non-data information.

32. The circuit of claim 31, wherein said information comprises serial information, and said decoder is further configured to receive said serial information.

33. A receiver, comprising:
a) the circuit of claim 19;
b) a processor in communication with said circuit, configured to process said data portions; and
c) a clock recovery circuit configured to recover a clock signal from serial information received by said receiver.

34. The receiver of claim 33, embodied on a single integrated circuit.

35. The receiver of claim 33, further comprising a divider configured to divide said recovered clock.

36. A system for transferring data on or across a network, comprising:
a) the receiver of claim 33;
b) at least one transmitter in communication with said receiver, said transmitter being configured to transmit said serial information to said receiver; and
c) at least one receiver port in communication with said receiver for receiving said serial information.

37. The system of claim 36, wherein said transmitter further comprises (i) a CRC calculator configured to calculate CRC information and (ii) a transmitter processor configured to add said CRC information to or insert said CRC information in said non-data.

38. The system of claim 36, wherein said receiver further comprises a control circuit configured to generate a control signal in response to said error detection circuit detecting (i) an error in said data portions and said zero-padded data portion of said information, or (ii) no error in said data portions and said zero-padded data portion of said information.

39. The system of claim 38, further comprising a control bus configured to transmit said control signal from said receiver to said transmitter.

40. A fabric adapter or fabric processor comprising the system of claim 36.

41. A network, comprising:
a) a plurality of the systems of claim 36, in communication with each other; and
b) a plurality of storage or communications devices, each of said storage or communications devices being in communication with one of said systems.

42. The network of claim 41, wherein said plurality of storage or communications devices comprises a plurality of storage devices.

43. A circuit for determining an information transmission error, comprising:
a) means for receiving digital information and detecting non-data in said digital information, said digital information comprising a plurality of data portions and a further portion containing data and said non-data of each of the data portions and the further portion having a fixed first length;
b) means for removing said non-data from said further portion to form a remainder having a second length less than said fixed first length;
c) means for combining a zero-pad vector with said remainder to form a zero-padded data portion having the fixed first length; and
d) means for detecting a transmission error in both (i) said data portions and (ii) said zero-padded data portion.

44. The circuit of claim 43, wherein said fixed first length is $2^n$ bits, where n is an integer of from 3 to 10.

45. The circuit of claim 43, wherein said information comprises a packet or a frame.

46. The circuit of claim 45, wherein said information comprises said packet, and said non-data comprises a packet header.

47. The circuit of claim 46, wherein said packet header has a fixed second length, and said fixed second length is less than said fixed first length.

48. The circuit of claim 47, wherein said fixed second length consists of $2^m$ bits, where m is an integer of from 3 to 8.

49. The circuit of claim 43, wherein said means for detecting said transmission error comprises a means for calculating cyclic redundancy code (CRC) on said data portions and said zero-padded data portion.

50. The circuit of claim 43, further comprising a means for transmitting a control signal in response to an error detected in said data portions and said zero-padded data portion.

51. The circuit of claim 43, further comprising a means for processing said data portions received from said error detection circuit.

52. The circuit of claim 51, wherein said means for processing comprises a means for reassembling said non-data and said data of said further portion.

53. The circuit of claim 43, further comprising a means for converting serial information into parallel information for processing by said means for detecting non-data information and said error detection circuit.

54. The circuit of claim 43, further comprising a means for decoding at least part of said non-data.

55. A receiver, comprising:
a) the circuit of claim 43;
b) a means for processing at least said data portions, in communication with said circuit; and
c) a means for recovering a clock signal from serial information received by said receiver.

56. The receiver of claim 55, embodied on a single integrated circuit.

57. The receiver of claim 55, further comprising a means for dividing said recovered clock.

58. A system for transferring data on or across a network, comprising:
a) the receiver of claim 55;
b) at least one means for transmitting serial information to said receiver; and
c) at least one means for receiving said serial information, said means for receiving being communicatively coupled to said receiver.

59. The system of claim 58, wherein said means for transmitting further comprises (1) a means for calculating CRC information and (ii) a means for adding said CRC information to or inserting said CRC information in said non-data.

60. The system of claim 58, wherein said receiver further comprises a means for generating a control signal in response to said means for detecting said transmission error detecting (i) an error in said data portions and said zero-padded data portion, or (ii) no error in said data portions and said zero-padded data portion.

61. A fabric adapter or fabric processor comprising the system of claim 58.

62. A network, comprising:

a) a plurality of the systems of claim 58, in communication with each other; and b) a plurality of discrete means for storing or communicating data, each of said discrete means for storing or communicating data being in communication with at least one of said systems.

63. The network of claim 62, wherein said plurality of discrete means for storing or communicating data comprises a plurality of discrete means for storing data.

* * * * *